United States Patent
Freeman et al.

(10) Patent No.: US 6,641,030 B1
(45) Date of Patent: Nov. 4, 2003

(54) METHOD AND APPARATUS FOR PLACING SOLDER BALLS ON A SUBSTRATE

(75) Inventors: Gary Freeman, Beverly, MA (US); Thomas Nowak, Jr., N. Hampton, NH (US); Thomas Purcell, Haverhill, MA (US); A. Jason Mirabito, Hull, MA (US); Thomas M. Sullivan, Salem, NH (US); Richard F. Foulke, Stoneham, MA (US); Richard F. Foulke, Jr., Hampstead, NH (US); Cord W. Ohlenbusch, Andover, MA (US)

(73) Assignee: Speedline Technologies, Inc., Haverhill, MA (US)

( * ) Notice: Subject to any disclaimer, the term of this patent is extended or adjusted under 35 U.S.C. 154(b) by 0 days.

(21) Appl. No.: 09/253,150

(22) Filed: Feb. 19, 1999

Related U.S. Application Data

(63) Continuation of application No. 08/795,543, filed on Feb. 6, 1997, now Pat. No. 6,427,903.
(60) Provisional application No. 60/103,500, filed on Oct. 8, 1998.

(51) Int. Cl.[7] .......................... B23K 35/12; B23K 1/00; H01L 29/40
(52) U.S. Cl. .................. 228/246; 228/245; 228/39; 228/41; 228/180.22; 257/737; 257/738
(58) Field of Search .............. 228/246, 41, 39, 228/180.22, 245, 33; 29/842; 257/737, 738

(56) References Cited

U.S. PATENT DOCUMENTS

| | | | |
|---|---|---|---|
| 3,472,365 A | 10/1969 | Tiedema | 206/56 |
| 3,589,000 A | 6/1971 | Galli | 29/590 |
| 4,209,893 A | 7/1980 | Dyce et al. | 29/522 |
| 4,216,350 A | 8/1980 | Reid | 174/68 |
| 4,437,232 A | 3/1984 | Araki et al. | 29/740 |
| 4,684,055 A | 8/1987 | Baer et al. | 228/180 |

(List continued on next page.)

FOREIGN PATENT DOCUMENTS

| | | | |
|---|---|---|---|
| EP | 0 902 610 A1 | 2/1998 | |
| EP | 0902610 A1 * | 3/1999 | 228/41 |

(List continued on next page.)

OTHER PUBLICATIONS

PCT International Search Report, for Speedline Technologies, application No. PCT/US 99/23096, dated Jan. 25, 2000.

*Primary Examiner*—Tom Dunn
*Assistant Examiner*—L. Edmondson
(74) *Attorney, Agent, or Firm*—Mintz, Levin, Cohn, Ferris, Glovsky and Popeo, P.C.

(57) ABSTRACT

An apparatus for placing spheres at predetermined positions on a substrate. The apparatus includes a platform to support the substrate at a first sphere placement position in the apparatus, and a placement station disposed above the platform that places spheres at locations on the substrate. The placement station includes a first container having a chamber to contain spheres, and a first carrier tray having a substantially horizontal upper surface that forms a lower surface of the chamber. The upper surface has a first section and a second section, the second section having a plurality of holes formed therein to receive spheres. The first carrier tray is movable to position the second section between a fill position beneath the first container and a place position disposed over the first sphere placement position. The placement station is constructed and arranged to fill the plurality of holes with spheres when the second section is in the fill position, and place the spheres at the predetermined positions on the substrate when the second section is in the place position.

15 Claims, 12 Drawing Sheets

U.S. PATENT DOCUMENTS

| | | |
|---|---|---|
| 4,712,721 A | 12/1987 | Noel et al. ............. 228/56.3 |
| 4,722,470 A | 2/1988 | Johary ................... 228/180 |
| 4,733,823 A | 3/1988 | Waggener et al. ....... 239/601 |
| 4,842,184 A | 6/1989 | Miller, Jr. ............... 228/180 |
| 4,871,110 A | 10/1989 | Fukasawa et al. ....... 228/245 |
| 4,872,261 A | 10/1989 | Sanyal et al. ............. 29/840 |
| 4,898,320 A | 2/1990 | Dunaway et al. ........ 228/245 |
| 4,903,889 A | 2/1990 | Svendsen, Leo G. et al. .......... 228/180 |
| 4,906,823 A | 3/1990 | Kushima et al. ........ 228/245 |
| 5,029,748 A | 7/1991 | Lauterbach et al. ..... 228/180 |
| 5,048,747 A | 9/1991 | Clark et al. ............ 228/180.2 |
| 5,088,639 A | 2/1992 | Gondotra et al. ...... 228/180.1 |
| 5,107,759 A | 4/1992 | Omori et al. ............. 101/114 |
| 5,108,024 A | 4/1992 | Kazem-Goudarzi et al. ......... 228/104 |
| 5,118,027 A | 6/1992 | Braun et al. ............ 228/180 |
| 5,118,584 A | 6/1992 | Evans et al. ............. 430/313 |
| 5,148,375 A | 9/1992 | Horikami ................. 364/552 |
| 5,159,535 A | 10/1992 | Desai et al. ............. 361/398 |
| 5,172,853 A | 12/1992 | Maiwald .................. 228/248 |
| 5,205,896 A | 4/1993 | Brown et al. ............ 156/297 |
| 5,211,328 A | 5/1993 | Ameen et al. .......... 228/180.2 |
| 5,219,117 A | 6/1993 | Lin ......................... 228/253 |
| 5,220,200 A | 6/1993 | Blanton ................... 257/778 |
| 5,254,362 A | 10/1993 | Shaffer et al. ............. 427/96 |
| 5,255,839 A | 10/1993 | de Costa Alves et al. ................ 228/180.21 |
| 5,261,593 A | 11/1993 | Casson et al. ........ 228/180.22 |
| 5,275,970 A | 1/1994 | Itoh et al. ................. 437/183 |
| 5,279,045 A * | 1/1994 | Odashima et al. .......... 34/10 |
| 5,284,287 A * | 2/1994 | Wilson et al. .......... 228/180.2 |
| 5,289,631 A | 3/1994 | Koopman et al. ......... 29/840 |
| 5,303,824 A * | 4/1994 | Kohn ..................... 206/449 |
| 5,323,947 A | 6/1994 | Juskey et al. ............ 228/56.3 |
| 5,356,658 A | 10/1994 | Hertz et al. ............... 427/96 |
| 5,356,838 A | 10/1994 | Kim ........................ 437/226 |
| 5,363,277 A | 11/1994 | Tanaka ..................... 361/760 |
| 5,373,984 A | 12/1994 | Wentworth ............ 228/180.1 |
| 5,388,327 A | 2/1995 | Trabucco .................. 29/830 |
| 5,392,980 A | 2/1995 | Swamy et al. ............ 228/119 |
| 5,431,332 A | 7/1995 | Kirby et al. .............. 228/246 |
| 5,438,223 A | 8/1995 | Higashi et al. ........... 257/774 |
| 5,445,313 A | 8/1995 | Boyd et al. ............ 228/248.1 |
| 5,454,159 A | 10/1995 | Norell ....................... 29/834 |
| 5,467,913 A * | 11/1995 | Namekawa et al. ........ 228/41 |
| 5,492,266 A | 2/1996 | Hoebener et al. ...... 228/248.1 |
| 5,497,938 A | 3/1996 | McMahon et al. .......... 228/253 |
| 5,499,487 A * | 3/1996 | McGill ........................ 53/473 |
| 5,511,306 A | 4/1996 | Denton et al. .............. 29/840 |
| 5,519,580 A | 5/1996 | Natarajan et al. .......... 361/760 |
| 5,540,377 A | 7/1996 | Ito ............................ 228/41 |
| 5,542,601 A | 8/1996 | Fallon et al. ............... 228/119 |
| 5,547,530 A | 8/1996 | Nakamura et al. ........... 156/89 |
| 5,551,216 A | 9/1996 | McGill ........................ 53/473 |
| 5,574,801 A | 11/1996 | Collet-Beillon .......... 382/150 |
| 5,601,229 A * | 2/1997 | Nakazato et al. ........... 28/246 |
| 5,607,099 A | 3/1997 | Yeh et al. ............. 228/180.22 |
| 5,620,129 A | 4/1997 | Rogren .................... 228/56.3 |
| 5,620,927 A | 4/1997 | Lee ........................... 29/841 |
| 5,626,277 A * | 5/1997 | Kawada ..................... 228/41 |
| 5,655,704 A * | 8/1997 | Sakemi et al. ............. 228/246 |
| 5,657,528 A * | 8/1997 | Sakemi et al. .............. 29/430 |
| 5,662,262 A | 9/1997 | McMahon et al. ......... 228/56.3 |
| 5,680,984 A | 10/1997 | Sakemi ..................... 228/246 |
| 5,683,942 A | 11/1997 | Kata et al. ................. 437/209 |
| 5,685,477 A * | 11/1997 | Mallik et al. .............. 228/254 |
| 5,704,536 A | 1/1998 | Chen et al. .................. 228/41 |
| 5,749,614 A | 5/1998 | Reid et al. .................. 294/64.1 |
| 5,762,258 A | 6/1998 | Le Coz et al. |
| 5,765,744 A | 6/1998 | Tatumi et al. .............. 228/254 |
| 5,816,482 A | 10/1998 | Grabbe |
| 5,839,641 A * | 11/1998 | Teng .......................... 228/41 |
| 5,918,792 A | 7/1999 | Stumpe et al. .............. 228/41 |
| 5,921,458 A | 7/1999 | Fan |
| 6,056,190 A * | 5/2000 | Foulke et al. .............. 228/246 |
| 6,065,201 A * | 5/2000 | Sakai ......................... 29/430 |
| 6,170,737 B1 * | 1/2001 | Foulke et al. .............. 228/245 |
| 6,202,918 B1 * | 3/2001 | Hertz ......................... 228/246 |
| 6,229,210 B1 * | 5/2001 | Casey ........................ 257/737 |
| 6,230,963 B1 * | 5/2001 | Hertz ......................... 228/246 |
| 6,234,382 B1 * | 5/2001 | Rischke et al. ............ 228/245 |
| 6,412,685 B2 * | 7/2002 | Hertz et al. ................. 228/246 |
| 6,427,903 B1 * | 8/2002 | Foulke et al. .............. 228/246 |

FOREIGN PATENT DOCUMENTS

| | | |
|---|---|---|
| GB | 2 177 642 A | 1/1997 |
| JP | 7-212023 * | 8/1995 |
| JP | 06137308 | 1/1996 |
| JP | 2-6030 | 1/2000 |
| WO | WO 98/34749 A | 8/1998 |
| WO | WO 98/36451 | 8/1998 |
| WO | WO 98/43307 A | 10/1998 |
| WO | WO 98/47330 | 10/1998 |

* cited by examiner

METHOD AND APPARATUS FOR PLACING SOLDER BALLS ON A SUBSTRATE

RELATED APPLICATIONS

This application is a continuation of U.S. patent application Ser. No. 08/795,543, filed Feb. 6, 1997 now U.S. Pat. No. 6,427,903. This application also claims priority from U.S. Provisional Application No. 60/103,500, filed Oct. 8, 1998, which is hereby incorporated by reference.

FIELD OF THE INVENTION

The present invention relates generally to the field of electronics assembly, and more specifically to methods and apparatus for placing solder balls on conductive pads of semiconductor substrates.

BACKGROUND OF THE INVENTION

During the manufacturing of semiconductor devices, it is common to place solder balls upon an array of conductive pads of a substrate of a semiconductor device and then reflow the solder balls in an oven to provide a series of electrical connections on the substrate. The array of solder balls is typically referred to as a ball grid array (BGA). In some applications, as many as 2000 solder balls about 0.012 inches to 0.030 inches in diameter are placed on a semiconductor substrate in an area of about four square inches. The large number of small sized solder balls used makes it difficult to consistently place a full array of solder balls on a semiconductor substrate using current machinery.

Currently, there are several different approaches for placing solder balls to form ball grid arrays on semiconductors and other electrical devices. In one approach, an array of solder balls is picked up with a vacuum head. Each solder ball is held by a separate vacuum nozzle in the vacuum head. The vacuum head then places the solder balls on the semiconductor substrate and releases the solder balls thereon.

In another approach, a mask is placed over the semiconductor substrate. The mask has an array of openings corresponding to the desired pattern of electrical connections on the substrate. A quantity of solder balls is then spread across the mask with an air knife or a squeegee causing solder balls to fall into the openings in the mask thereby positioning the solder balls in the desired pattern on the substrate.

In still another approach, a transfer substrate is formed with an array of indentations corresponding to the desired pattern of electrical connections on a semiconductor substrate. The array of indentations is then filled with solder balls, and the semiconductor substrate is brought face down into contact with the array of solder balls lying on the transfer substrate.

Using one of the above-described approaches, it is possible to place solder balls on a semiconductor substrate. However, these approaches typically have less than desired reliability and throughput, and therefore, it is desirable to provide a solder ball placement apparatus and method having improved reliability and throughput over the prior art approaches described above.

SUMMARY OF THE INVENTION

In one general aspect, the present invention features an apparatus for placing spheres at predetermined positions on a substrate. The apparatus includes a platform to support the substrate at a first sphere placement position in the apparatus, and a placement station disposed above the platform that places spheres at locations on the substrate. The placement station includes a first container having a chamber to contain spheres, and a first carrier tray having a substantially horizontal upper surface that forms a lower surface of the chamber. The upper surface has a first section and a second section. The second section has a plurality of holes formed therein to receive spheres. The first carrier tray is movable to position the second section between a fill position beneath the first container and a place position disposed over the first sphere placement position. The placement station is constructed and arranged to fill the plurality of holes with spheres when the second section is in the fill position, and place the spheres at the predetermined positions on the substrate when the second section is in the place position.

The placement station can further include a vision system positionable over the first carrier tray to view the spheres in the plurality of holes prior to placement of the spheres on the substrate. The vision system can be further positionable to view the spheres on the substrate after placement of the spheres on the substrate. At least a portion of the platform can be movable along a first axis and a second axis to position the substrate, wherein the first axis is orthogonal to the second axis, and wherein the first axis and the second axis define a plane that is substantially parallel to the upper surface of the first carrier tray. The apparatus can further include a first pedestal constructed and arranged to lift the substrate above the platform prior to placement of spheres on the substrate, the first pedestal being movable, independent of the platform, to align the predetermined positions on the substrate with spheres on the first carrier tray. The first pedestal can be constructed and arranged to provide movement of the substrate along the first axis and the second axis and to provide rotation of the substrate about an axis that is perpendicular to the plane defined by the first and the second axis. The vision system can be positionable over the pedestal to view the substrate prior to placement to determine any error in alignment between the predetermined positions on the substrate and spheres on the first carrier tray.

The placement station of the apparatus can further include a placement head. In one embodiment the placement head has a plurality of placement pins each corresponding to one of the plurality of holes in the upper surface of the first carrier tray, and the placement head is disposed above the first sphere placement position and can be lowered to place each of the pins in contact with a sphere in a hole of the first carrier tray to push the sphere through the hole and onto the substrate. In a second embodiment, the placement head may use pressurized air to push the spheres onto the substrate. The placement station can also further include a second container having a chamber to contain spheres, and a second carrier tray having a substantially horizontal upper surface that forms a lower surface of the chamber of the second container, the upper surface having a first section and a second section, the second section having a plurality of holes formed therein to receive spheres, the second carrier tray being movable to position the second section between a fill position beneath the second container and the place position. The placement station is constructed and arranged to fill the plurality of holes in the second carrier tray with spheres when the second section of the second carrier tray is in the fill position, and place the spheres at the predetermined positions on the substrate when the second section of the second carrier tray is in the place position.

The first carrier tray can include a lower section disposed beneath the second section of the upper surface, the lower section having a plurality of holes corresponding to the plurality of holes in the second section, the first carrier tray being constructed and arranged to allow relative movement between the lower section and the second section between a first relative position in which the holes in the second section are in align with the holes in the lower section and a second relative position in which the holes in the second section are not in align with the holes in the lower section.

The first container can include at least one deflection plate disposed within the chamber, the deflection plate having a deflection surface and being disposed in the chamber such that the deflection surface forms an obtuse angle with the upper surface of the first carrier tray. The apparatus can further include a conveyor system, disposed on the platform, to load and unload substrates from the apparatus, the conveyor system having a first conveyor section, a second conveyor section and a third conveyor section, each of the first conveyor section, the second conveyor section and the third conveyor section being independently controllable, the second conveyor section being disposed on the moveable portion of the platform.

The apparatus can further include a flux station, disposed above a flux position on the platform, that places flux on substrates. The flux station can further include a vision system positionable over the flux position to view a substrate at the flux position. The apparatus can further include a second pedestal constructed and arranged to lift a substrate at the flux position above the platform prior to placement of flux on the substrate, the second pedestal being movable, independent of the platform.

In a second general aspect, the invention features a method of placing a pattern of solder spheres at predetermined positions on a substrate using a carrier plate having holes formed in an upper surface thereof. The method includes steps of loading solder spheres into the carrier plate while the upper surface of the carrier plate is in a substantially horizontal position, positioning the substrate beneath the carrier plate, and pushing the solder spheres through the holes in the carrier plate and onto the substrate.

The method can include a step of using a vision system after the step of loading and before the step of pushing to verify that each of the holes contains a solder sphere. The method can further include a step of using the vision system to inspect the solder spheres on the substrate after the step of pushing. The step of positioning can include a step of aligning the substrate with the carrier plate using the vision system. The method can include a step of applying flux to the substrate. The upper surface of the carrier plate can includes a first substantially smooth section and a second section, the second section containing the holes, and the step of loading can include a step of moving the carrier plate beneath a container of solder balls from a first position to a second position, wherein in the first position, the first section of the upper surface of the carrier plate forms a bottom surface of the container, and in the second position the second portion of the carrier plate forms the bottom surface of the container. The step of positioning the substrate beneath the carrier plate can includes a step of moving the carrier tray from the second position to the first position. The carrier plate can be moved more quickly from the first position to the second position than from the second position to the first position to cause the solder spheres in the container to substantially fluidize when the carrier plate is moved from the first position to the second position. The step of pushing can include as step of applying pressurized air to the solder spheres.

In still another general aspect, the invention features an apparatus for placing a pattern of solder spheres at predetermined positions on a substrate. The apparatus includes means for loading solder spheres into holes in an upper surface of a the carrier plate while the upper surface of the carrier plate is in a substantially horizontal position, means for positioning the substrate beneath the carrier plate, and means for forcing the solder spheres from the holes in the carrier plate onto the substrate.

The apparatus can include means for verifying that each of the holes contains a solder sphere. The apparatus can further include means for inspecting the solder spheres on the substrate. The means for positioning can include means for aligning the substrate with the carrier plate using a vision system. The apparatus can further include means for applying flux to the substrate. The means for loading can include a container of solder balls, and means for substantially fluidizing the solder balls in the container. The means for forcing can include means for applying air to the solder spheres.

In still another general aspect, the invention features an apparatus for placing solder spheres at predetermined positions on a substrate. The apparatus includes a frame a platform, coupled to the frame, that supports the substrate at a sphere placement position in the apparatus, a carrier plate, coupled to the frame, having an upper surface with a plurality of holes formed therein to receive solder spheres, the carrier plate being movable between a fill position at which solder spheres are loaded into the holes and a place position at which the solder spheres are moved from the holes onto the predetermined positions on the substrate, and a vision system positionable over the carrier plate to view the spheres in the plurality of holes prior to placement of the spheres on the substrate.

BRIEF DESCRIPTION OF THE DRAWINGS

For a better understanding of the present invention, reference is made to the drawings which are incorporated herein by reference and in which.

DETAILED DESCRIPTION

Figure 1:
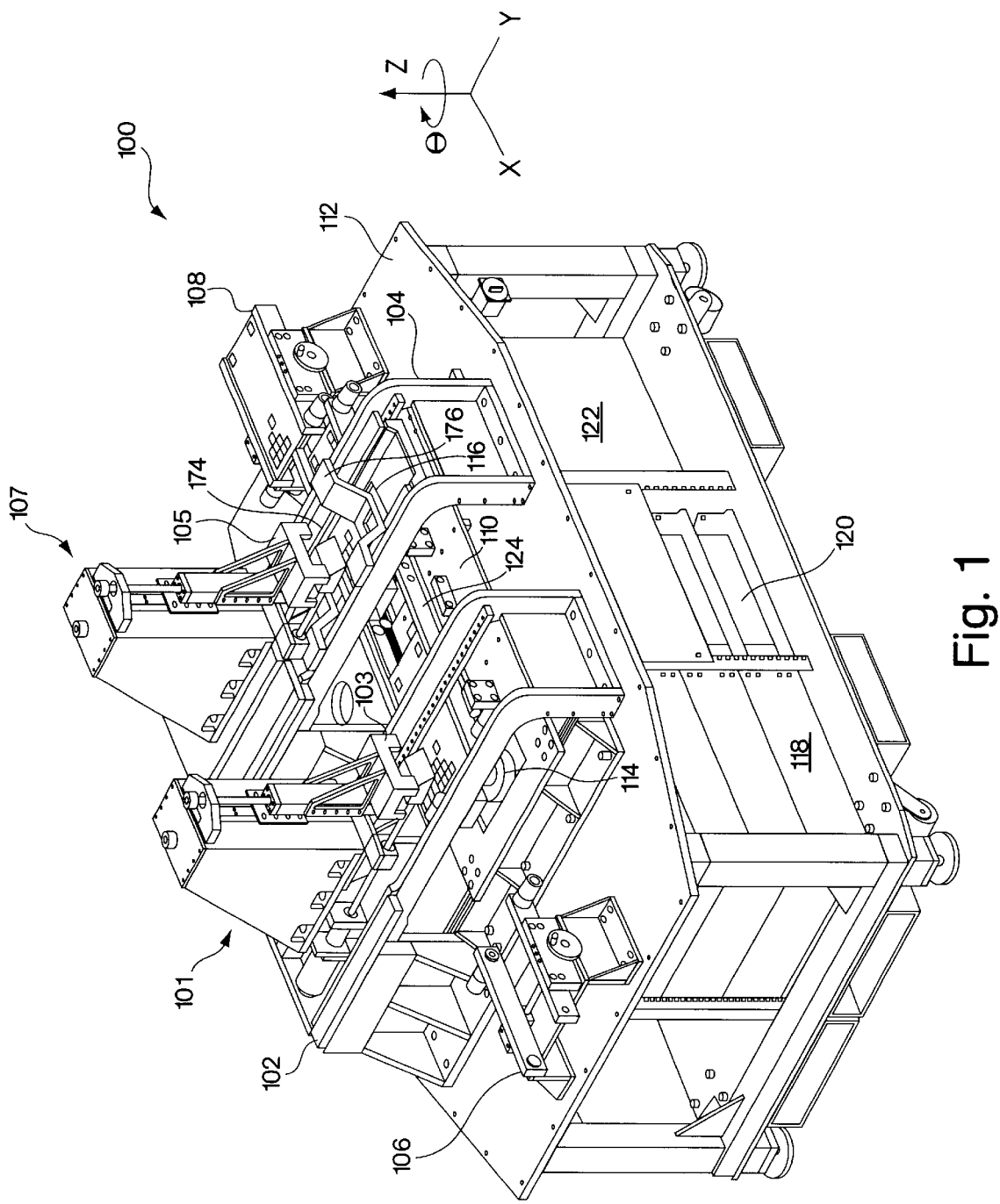
FIG. 1 is a perspective view of a solder ball placement apparatus in accordance with a first embodiment of the present invention.

FIG. 1 shows a solder ball placement apparatus 100 in accordance with a first embodiment of the present invention. The solder ball placement apparatus includes a flux gantry 102, a placement gantry 104, an input buffer conveyor 106, an output buffer conveyor 108, and an X-Y component transport table 110 each of which is mounted to a working platform 112. In addition, two moving pedestals 114 and 116 are mounted to the underside of the component transport table. Moving pedestal 114 is mounted beneath the flux gantry while moving pedestal 116 is mounted beneath the placement gantry. Mounted on the flux gantry 102 is a flux station 101 having a flux head 103, and mounted on the placement gantry 104 is a place station 107 having a placement head 105. Beneath the working platform 112 are electronic bays 118, 120 and 122 that contain control electronics, including a computer, for controlling the operation of the solder ball placement apparatus.

The solder ball placement apparatus receives semiconductor substrates for semiconductor parts having an array of conductor pads each of which is to receive a solder ball, places flux on each of the conductor pads using the flux head 103 of the flux gantry 102, and places a solder ball on each of the conductor pads using the place head 105 of the placement gantry 104. Embodiments of the solder ball placement apparatus are capable of receiving single BGA parts, BGA strips, single BGA parts in a JEDEC tray, and single BGA parts in Auer® boats.

The input buffer conveyor 106 and the output buffer conveyor 108 are substantially identical and are designed to receive parts from or provide parts to an automatic loader/unloader, such as a JEDEC tray loader/unloader, or an upstream or downstream machine in an automated production line. In one embodiment, the input buffer conveyor, the output buffer conveyor and the control electronics for the conveyors are compatible with SMEMA standards to coordinate transfer of parts from upstream and downstream machines in an automated assembly line.

The component transport table 110 is movable in two directions (X and Y) across the surface of the working platform 112 to receive parts, or trays containing parts, from the input buffer conveyor 106, deliver parts to the output buffer conveyor 108 and position parts beneath the flux gantry 102 and the placement gantry 104. The component transfer table includes a conveyor system 124 having independently operable conveyor segments. Each of the conveyor segments includes a stop mechanism for stopping movement of a part or tray at a work position beneath either the flux gantry or the placement gantry.

When a tray, such as a JEDEC tray, is used to load a plurality of parts into the solder ball placement apparatus, the X and Y motion of the component transfer table is used to position individual parts in the tray at the work positions. The stop mechanisms, gantries, and conveyor segments are arranged such that a part in a first tray, located beneath the flux gantry, can be moved to the work position beneath the flux gantry at the same time that a part in a second tray, located beneath the placement gantry, is moved to the work position beneath the placement gantry. The movement of the component table and the movement of the conveyor system on the component table is controlled by the control electronics and the computer contained in the electronics bays.

The moving pedestals 114 and 116 provide precise alignment of parts with respectively the flux head 103 and the placement head 105. Each of the moving pedestals is positioned beneath an opening in the component transfer table to enable an extension rod of the moving pedestal to extend through the component transfer table. The extension rods of the moving pedestals lift a part, at the work position beneath one of the gantries, from a tray containing the part (or in the case of a single part, lift the part off of the conveyor system of the component table), move the part in a Z-direction towards either the flux head or the placement head, and align the part with either the flux head or the placement head in X, Y, and θ. As described below in greater detail, in embodiments of the present invention, a vision alignment system is used to provide alignment of parts on the extension rods with one of the heads.

Figure 2:
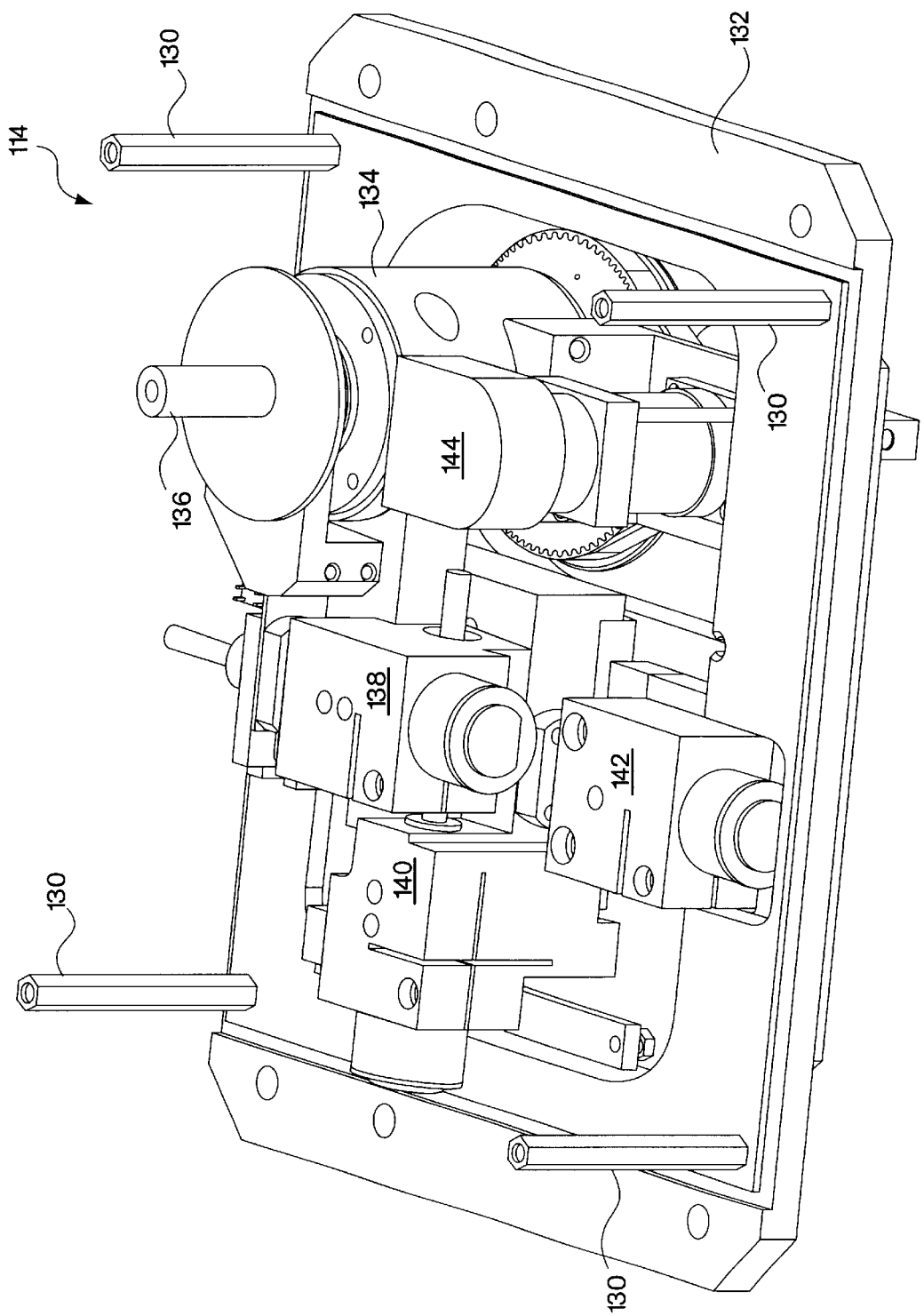
FIG. 2 is a top view of a moving pedestal of the solder ball placement apparatus of FIG. 1.

Moving pedestal 114 will now be described in greater detail with reference to FIG. 2. Moving pedestal 116 is substantially identical to moving pedestal 114. Moving pedestal 114 includes four mounting posts 130, a frame 132, an extension rod housing 134 from which the extension rod 136 extends, a θ-axis motor 138, an X-axis motor 140, a Y-axis motor 142 and a Z-axis motor 144. The four mounting posts 130 are coupled to the frame 132 and are used to couple the moving pedestal 114 to the underside of the component table. The extension rod housing 134 contains a pair of independently movable ball screws coupled to the extension rod 136. One of the balls screws is coupled to the θ-axis motor, and the other ball screw is coupled to the Z-axis motor. To raise the extension rod to lift a part from a frame, the Z-axis motor is activated to move one of the ball screws. To provide θ-axis movement of a part lifted by the extension rod, both the Z-axis motor and the θ-axis motor are activated to rotate both ball nuts in the housing 134. The X-axis motor 140 and the Y-axis motor are used to position the extension rod (and a part lifted by the extension rod) along the X-axis and the Y-axis (see FIG. 1 for orientation of axes).

The flux station 101 will now be described further with reference to FIG. 3. In addition to the flux head 103, the primary components of the flux station 101 include a frame 150, a tower section 152, a flux head vision shuttle 154, a flux cartridge 156, and a doctor blade assembly 158. The tower section 152 is coupled to the frame 150 and contains motors and drive assemblies for moving the flux head 103 in the Z-axis direction.

The flux head vision shuttle 154 is part of a vision alignment system that is used to align a part, lifted by the moving pedestal 114, with the flux head 103. The flux head vision shuttle includes a mirror 160 that is positioned at a 45 degree angle with respect to the top surface of the part to reflect an image of the part, raised by the moving pedestal, to a camera (not shown) located beneath the frame 150. In one embodiment, an on-axis illumination system is provided in the flux head vision shuttle to illuminate the part during the alignment process.

Figure 3:
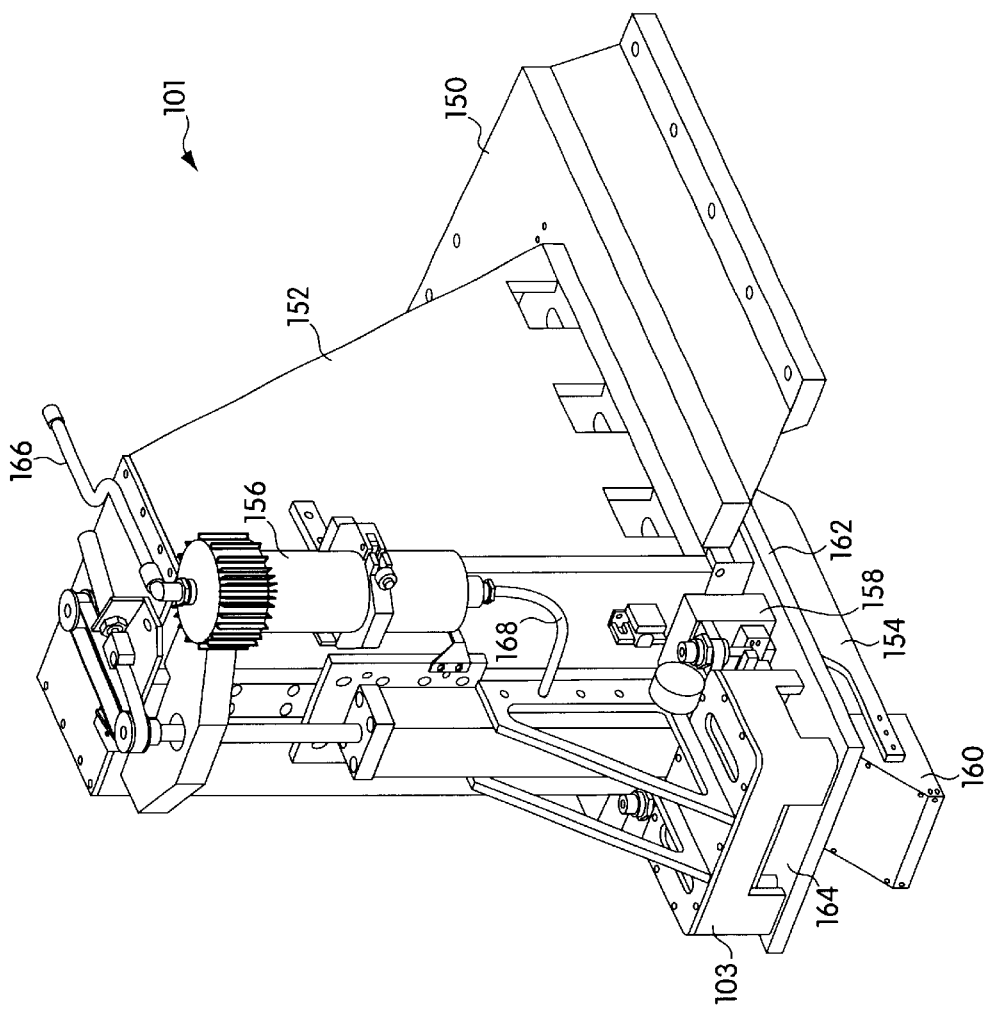
FIG. 3 is a perspective view of a flux station of the solder ball placement apparatus of FIG. 1 with a flux head vision shuttle in an extended position.
Figure 4:
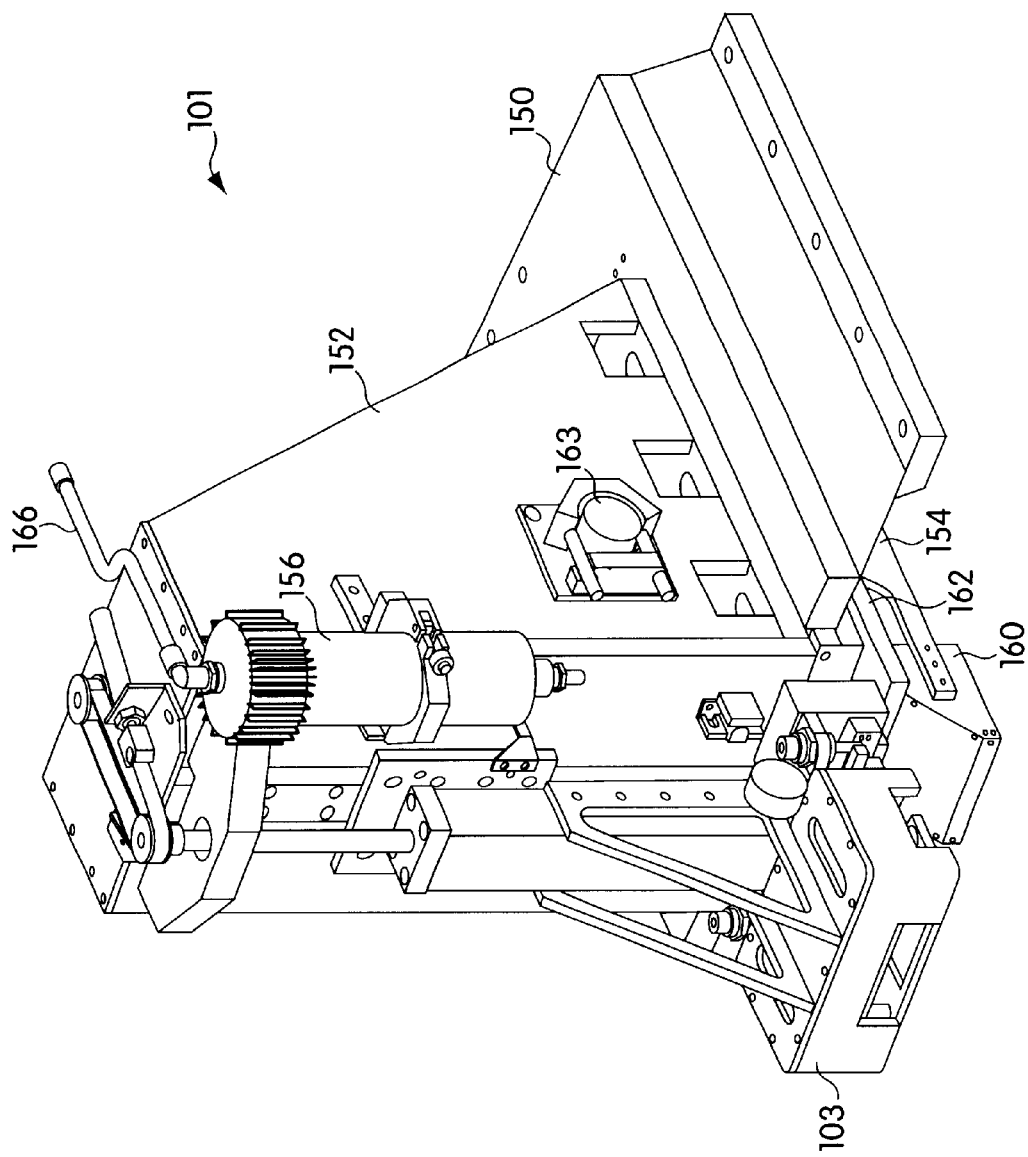
FIG. 4 is a perspective view of the flux station of the solder ball placement apparatus of FIG. 1 with the flux head vision shuttle in a retracted position.

The flux head vision shuttle is movable between an extended position shown in FIG. 3 and a retracted position shown in FIG. 4. In the extended position, the mirror is disposed along the Z-axis between the part and the flux head 103. In the retracted position, the mirror is disposed beneath the frame 150 to allow the flux head to be lowered to the part to place flux on the contact pads of the part. FIG. 4 also shows the motor assembly 163 for moving the mirror between the extended position and the retracted position.

The flux head vision shuttle also includes a flux head platen 162 having a lower surface to which the mirror 160 is coupled, and having an upper surface 164 upon which a flux pool is created by the doctor blade assembly 158, as is described below.

In one embodiment of the present invention, a pin transfer method is used to place flux onto the contact pads of the part. In this embodiment, the flux head contains a flux head pin assembly having an array of pins oriented such that each pin corresponds to one of the contact pads of the part. When the flux head vision shuttle is in the extended position for alignment of the part with the flux head, the flux head is lowered towards the flux head platen to dip the pins of the pin assembly into the flux pool on the flux head platen 162. When the flux head vision shuttle is retracted, the flux head is further lowered to place each of the pins in contact with one of the contact pads to transfer flux from the pins to the contact pads. In this embodiment, the flux head pin assembly is replaceable to accommodate different parts having different arrays of contact pads.

The flux cartridge 156 is a replaceable cartridge that supplies flux to the doctor blade assembly 158. The flux cartridge is coupled to an inlet air hose 166 to receive pressurized air from an air source to provide a constant pressure to flux contained in the flux cartridge. The flux cartridge is also coupled to an outlet line 168 to provide flux to a pump (not shown). In one embodiment, the pump is implemented using a diastolic pump, that in response to a signal from the computer and control electronics, dispenses a predetermined quantity of flux to the doctor blade assembly 158.

Figure 5:
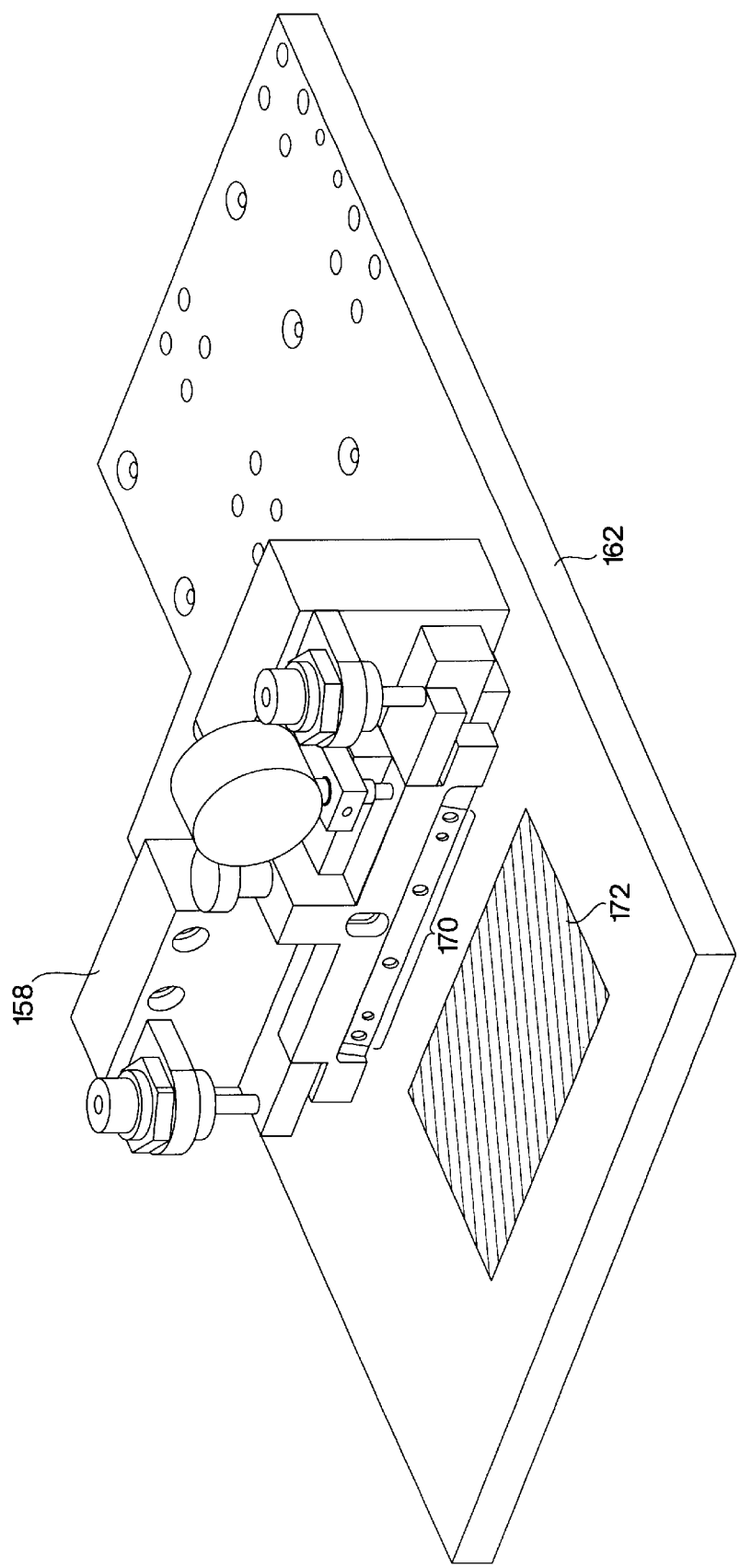
FIG. 5 is a perspective view of a doctor blade assembly and a flux head platen of the flux station shown n FIG. 4.

FIG. 5 shows the doctor blade assembly 158 and the flux head platen 162 in greater detail with the flux head platen in the extended position. In FIG. 5, both the doctor blade assembly and the flux head platen are shown removed from the flux station. The doctor blade assembly includes a blade 170 that is movable along the Z-axis between a raised position and a lowered position. At the lowered position, the blade 170 is at a predetermined height over the top surface of the flux head platen. In FIG. 5, the blade 170 is shown in the lowered position.

Flux is dispensed across the top surface of the flux head platen as follows. With the flux head platen in the retracted position, the diastolic pump dispenses flux onto the top surface of the flux head platen behind blade 170. The flux head platen is then moved to the extended position shown in FIG. 3. As the flux head platen is moved to the extended position, the blade 170 contacts the flux and spreads the flux across the flux head platen to form a pool of flux 172 on the flux head platen. When the flux head platen is moved from the extended position to the retracted position, the blade 170 is raised to prevent it from contacting the pool of flux.

The place station 107 will now be described further. As shown in FIG. 1, the place station includes the same major components as the flux station 101 including the frame 150, and the tower section 152. The place station includes a place head vision shuttle 174 that is substantially similar to the flux head vision shuttle 154, except that the place head vision shuttle does not include the flux head platen and the doctor blade assembly. The place head of the place station, similar to the flux head, is movable in the Z-axis direction under the control of motors and drive assemblies disposed on the tower section.

Figure 6:
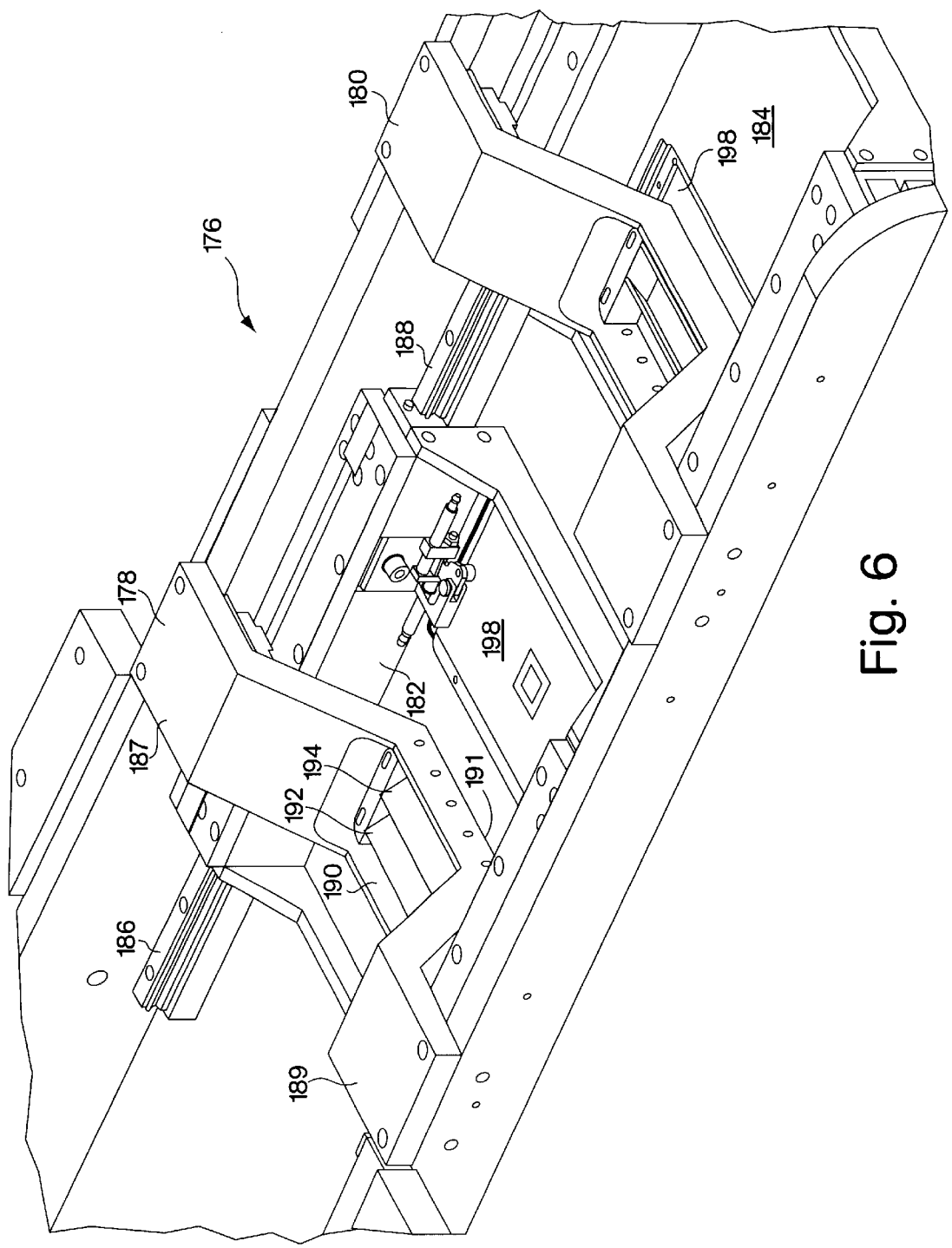
FIG. 6 is a perspective view of a carrier shuttle and fill station of the solder ball placement apparatus of FIG. 1.

The place station also includes a carrier shuttle and fill station 176, disposed on the placement gantry, which will now be described in further detail with reference to FIG. 6. The carrier shuttle and fill station includes a back carrier fill station 178, a front carrier fill station 180, a front carrier tray 182, a back carrier tray 184, a front pair of rails 186 and a back pair of rails 188. Only one rail of each of the front pair of rails and the back pair of rails are visible in FIG. 6. The front and back carrier fill stations and the front pair and back pair of rails are fixed to the placement gantry. The front carrier tray 182 and the back carrier tray 184 are mounted to respectively the front pair of rails and the back pair of rails, and are movable in the Y-axis direction along the rails under the control of motors (not shown).

Both the front carrier tray and the back carrier tray include a ball carrier 198. During operation of the solder ball placement apparatus 100, the front carrier tray and the back carrier tray are moved between a fill position beneath respectively the front fill station 180 and the back fill station 178 and a place position, which is located between the place head 105 and the place station moving pedestal 116. At the fill position, solder balls are loaded into the ball carrier 198, and at the place position, the solder balls are placed onto a part on the place station moving pedestal. In FIG. 6, the back carrier tray is shown in the place position, while the front carrier tray is shown in the fill position.

The front carrier fill station 178 and the back carrier fill station 180 are substantially identical, and the back carrier fill station will now be described in greater detail. The back carrier fill station includes mounting sections 187 and 189 and a solder ball container 190. The mounting sections are used for mounting the back carrier fill station to the gantry, and the solder ball container is used to contain solder balls (not shown) prior to their placement on the ball carrier (described below). The upper surface of the back carrier tray 182 provides the bottom surface of the solder ball container 190. The solder ball container has two deflection plates 192 and 194 positioned at a deflection angle of approximately 45 degrees. The deflection plates are used to evenly disperse solder balls across the bottom of the solder ball container. In other embodiments, the angle of deflection of the deflection plates can be more or less than 45 degrees, and more or fewer deflection plates can be used. In one embodiment of the present invention a mylar strip is placed along a bottom edge of the solder ball container at point 191 in FIG. 6. The mylar strip moves across solder balls in the ball carrier when the carrier trays are moved from the fill position to the place position. The mylar strip removes any stray solder balls from the ball carrier and contains them in the solder ball container.

In embodiments of the present invention, it is desirable to fluidize the solder balls in the solder ball container 190 when the carrier tray is moved from the place position to the fill position. The term fluidize is used herein to describe a state of motion of the solder balls wherein the solder balls are disrupted and mixed amongst themselves in such a way that the solder balls appear to be in a fluid state. Fluidizing the solder balls causes them to flow across the top of the carrier tray so that each hole in the ball carrier is filled with a solder ball. In embodiments of the present invention, the deflection plates help to fluidize the balls. In addition, to fluidize the balls when filling the holes, the carrier tray is moved from the place position to the fill position more quickly than when it is moved form the fill position to the place position.

Figure 7:
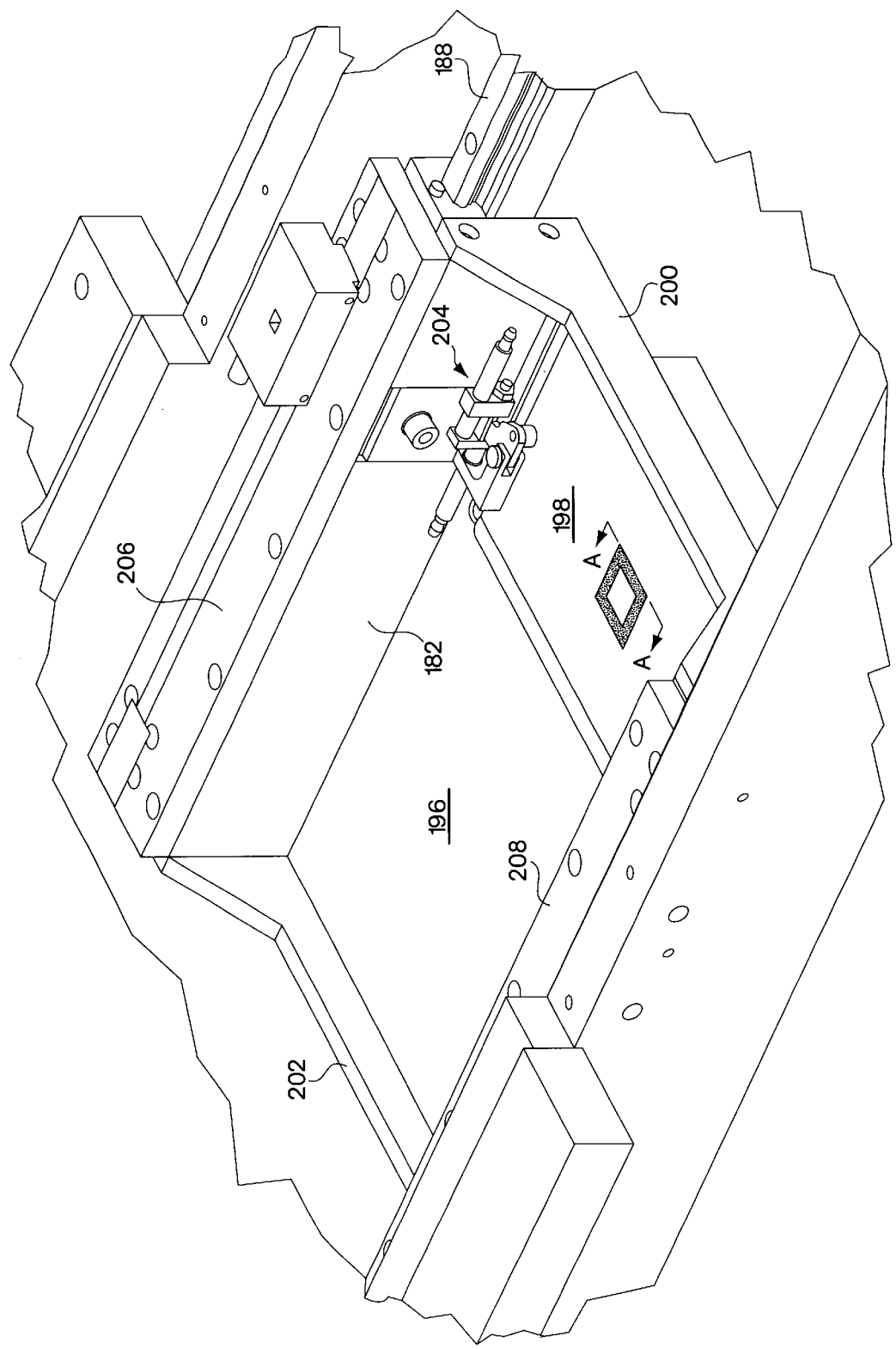
FIG. 7 shows a carrier tray of the carrier shuttle and fill station in greater detail.

The back carrier tray 182 will now be described in greater detail with reference to FIG. 7. The front carrier tray 184 is substantially identical to the back carrier tray except that the ball carrier 198 in the front carrier tray 184 is positioned in the back portion of the tray while the ball carrier 198 in the back carrier tray 182 is positioned in the front portion of the tray. FIG. 7 shows the back carrier tray with the back carrier fill station removed. The back carrier tray 182 includes rail mounting brackets 206 and 208, a bottom surface 196, a ball carrier 198, a carrier shutter trigger 204 and front and back side rails 200 and 202.

The mounting brackets 206 and 208 are used to secure the back carrier tray to the left and right rails of the gantry system. The front side rail 200 and the back side rail 202 provide rigidity to the carrier trays and also contain any stray solder balls within the carrier trays. The ball carriers 198 are removably mounted to an open portion in the bottom surface of the carrier trays. The ball carrier 198 is replaceable to accommodate placing solder balls on parts having different conductor pad layouts.

Figure 8:
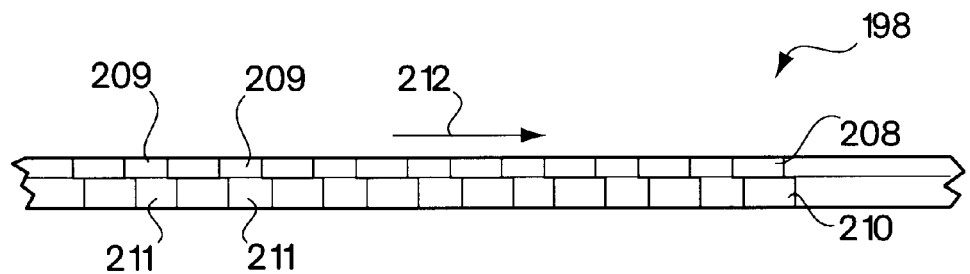
FIG. 8 shows a cross-sectional side view taken along line A—A of FIG. 7 of a first embodiment of a ball carrier used in the carrier tray of FIG. 7.

A cross-sectional side view of the ball carrier 198 in accordance with one embodiment is shown in FIG. 8. The ball carrier 198 includes a carrier shuttle 208 and a main carrier body 210. The carrier shuttle has holes 209 for receiving solder balls at the fill station, and the main carrier body has holes 211 through which the solder balls pass to the part at the place position. Each of the holes 209 has a diameter slightly larger than the diameter of the solder balls to be placed. The holes 211 are of approximately the same diameter as the holes 209. The carrier shuttle is movable with respect to the main carrier body under the control of the carrier shutter trigger 204. In FIG. 8, the ball carrier is shown in a fill state with the holes 209 of the carrier shuttle offset from the holes 211 of the main carrier body by a distance equal to approximately half the diameter of the holes 209. When the ball carrier is in the place position, and placing of solder balls on a part is to occur, the carrier shutter trigger is activated to move the carrier shuttle in the direction shown by arrow 212 to align holes 209 with holes 211. In one embodiment, the carrier shuttle is made from steel, the main carrier body is made from brass, and the main carrier body includes magnets that hold the carrier shuttle to the main carrier body to prevent the carrier shuttle from inadvertently moving.

Figure 9:
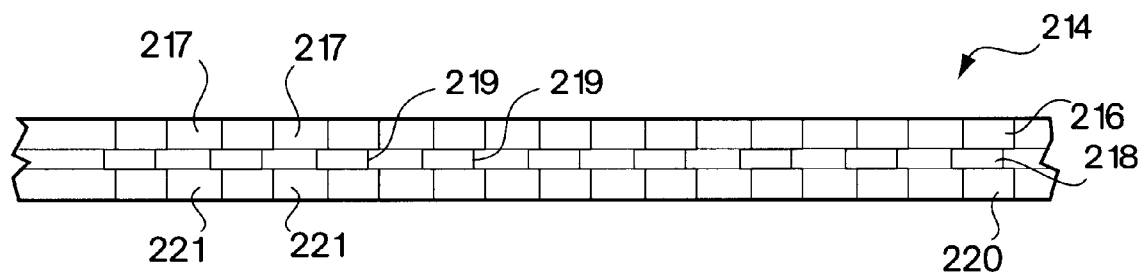
FIG. 9 shows a cross-sectional side view of a second embodiment of a ball carrier used in the carrier tray of FIG. 7.

A second embodiment of a ball carrier 214 is shown in FIG. 9. The ball carrier 214 includes an upper plate 216, a middle plate 218, and a lower plate 220. The upper plate has holes 217 aligned with holes 221 of the lower plate. The middle plate 218 has holes 219 shown in misalignment with the holes 217 and 221. The middle plate 218 is movable under the control of the carrier shuttle trigger to move the middle plate between a fill position shown in FIG. 9 and a place position in which the holes 219 are aligned with the holes 217 and 221.

The place head 105 will now be described in greater detail with reference to FIG. 10. The place head includes a main body 224, and a place head pin assembly 226. The place head is coupled to the drive mechanism of the tower of the place station using a bracket 228. The place head pin assembly is located to the main body 224 using pins 230 and 232, and is replaceable to accommodate placing solder balls on parts having different conductor pad layouts. The place head pin assembly has pins 234 that are used to push solder balls through the holes of the ball carrier 198 and on to the conductor pads of a part loaded into the solder ball placement apparatus 100. In one embodiment, the pins are implemented using receptacles and pins available from Everett Charles Technologies of Pomona, Calif. under part no. Pogo-725 (receptacles) and HPR-72W (pins).

Figure 11:
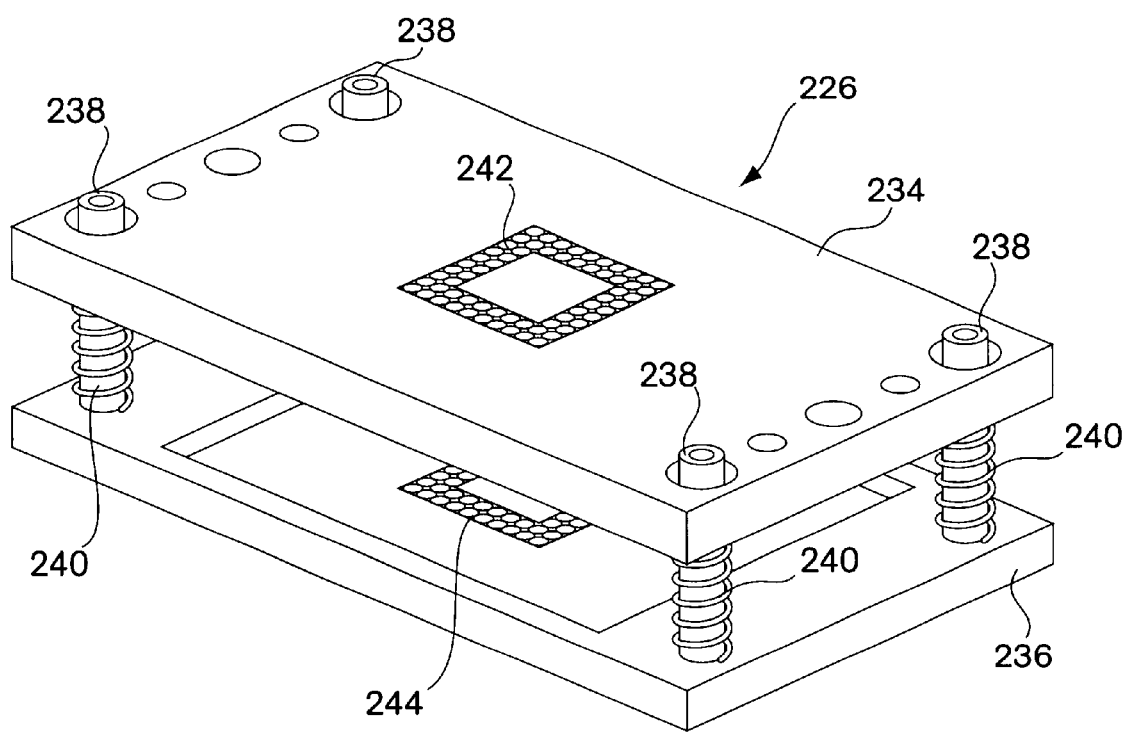
FIG. 11 is a perspective view of a place head pin assembly used in the place head of FIG. 10.

The place head pin assembly 226 is shown in greater detail in FIG. 11 with the pins 234 removed. The place head pin assembly includes an upper plate 234 and a lower plate 236 coupled together using four linear bearings and bolts 238 each of which has a spring 240. The upper plate 234 and the lower plate 236 have hole patterns respectively 242 and 244 through which the pins 234 pass. The linear bearings are used in part to align the hole pattern of the upper plate with the hole pattern of the lower plate. The hole patterns 234 and 236 match the conductor pad pattern of the part that is to receive solder balls.

The place head 105 operates as follows. A part is positioned beneath the place head and properly aligned using the moving pedestal 116 and the vision alignment system of the place station. Then, a filled ball carrier in either the front carrier tray or the back carrier tray is moved to the place position between the place head 205 and the part. Next, the moving pedestal raises the part until it comes close to contacting the underside of the ball carrier. In one embodiment, the gap between the part and the ball carrier is equal to less than half the diameter of the solder balls. The carrier trigger 204 is then activated to move the carrier shuttle 208 to align the holes in the carrier shuttle with the holes in the main carrier body 210. The place head is then lowered towards the part and the lower plate 236 of the place head pin assembly 226 contacts the ball carrier 198. The place head continues to be lowered compressing springs 240 and causing the pins 234 to extend through the lower plate and contact the solder balls in the carrier plate. The pins force the solder balls through the holes 209 and 211 and onto the contact pads of the part. The place head is then raised and the part is lowered back into its tray.

Figure 10:
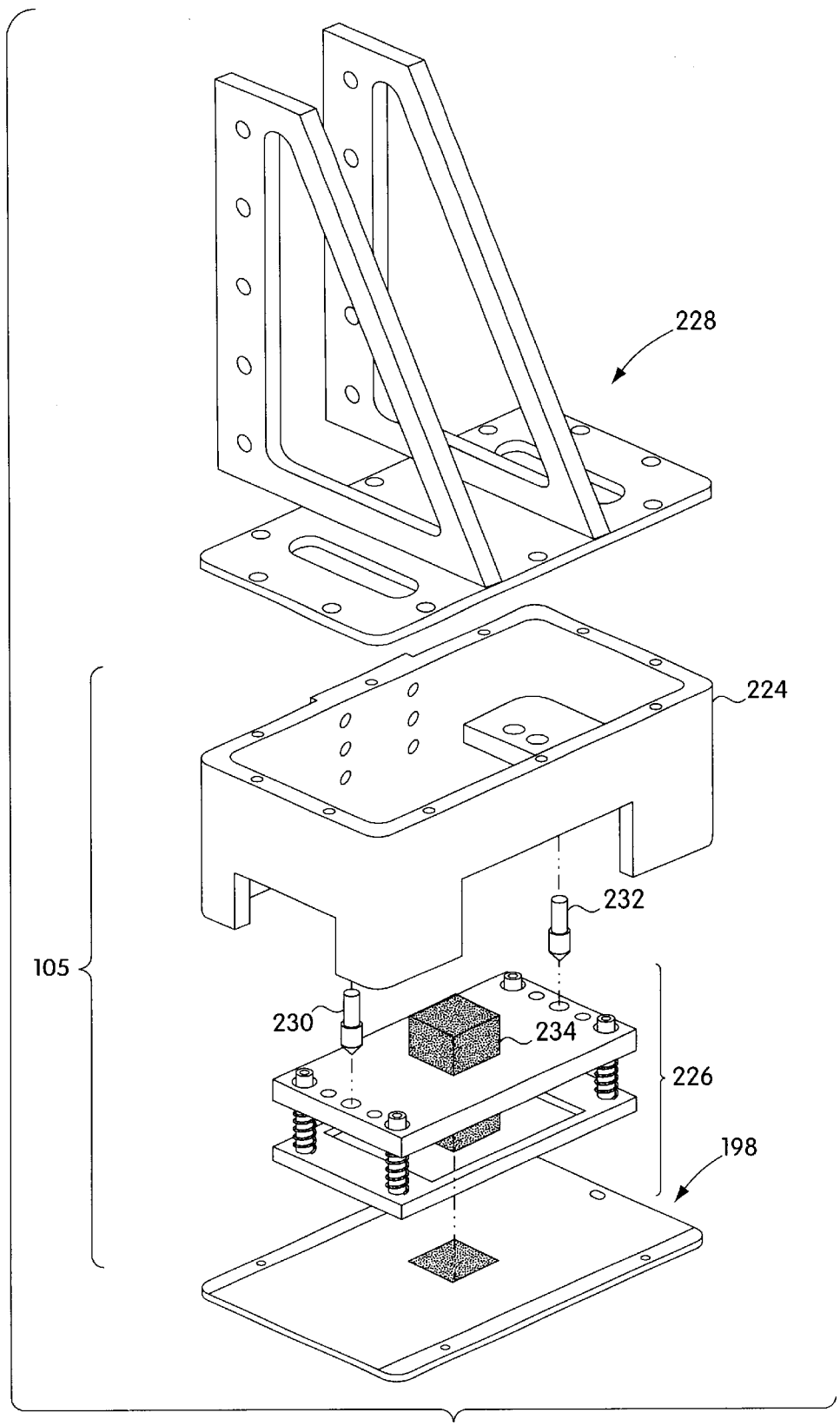
FIG. 10 is an exploded view of a place head used with the solder ball placement apparatus of FIG. 1.

The flux head 103 is similar to the place head shown in FIG. 10, except that the flux head does not include the springs 240, and the pins of the flux head extend a fixed distance through the lower plate to control the depth to which the pins are dipped into the flux pool 172.

The place station vision alignment system is substantially identical to the flux head vision alignment system, except that in some embodiments, the place station vision alignment system includes a second illumination system. The second illumination system is used to provide shallow angle illumination of a part after placement of solder balls to allow inspection of the solder balls on the part. In one embodiment, the second illumination system includes an array of light emitting diodes mounted to or in close proximity with the 45 degree mirror.

Figure 12:
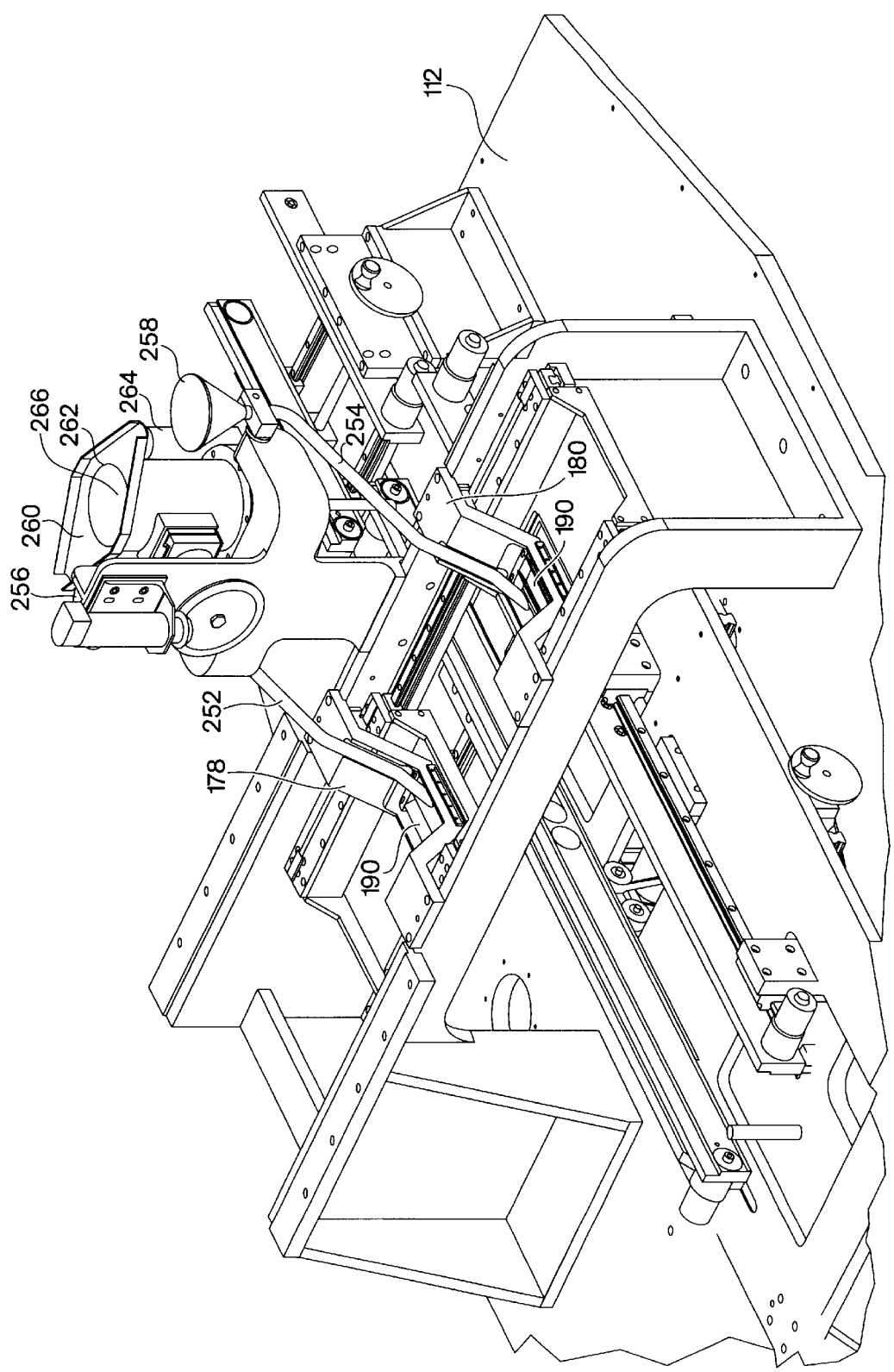
FIG. 12 is a perspective view of an optional ball dispense metering system used with the solder ball placement apparatus of FIG. 1.

An optional ball dispense metering system 250 will now be described with reference to FIG. 12, which shows the ball dispense metering system 250 mounted on the solder ball placement apparatus. In FIG. 12, parts of the place station 107 are removed to show the ball dispense metering system more clearly. The ball dispense metering system is used to refill the ball containers 190 of the front carrier fill station 180 and the back carrier fill station 178 with solder balls. The ball dispense metering system includes fill tubes 252 and 254, funnels 256 and 258, a tilt plate 260, and a dispensing system 264. The dispensing system 264 includes a container 266 filled with solder balls and having an open top 262. The bottom of the container is formed by the top surface of a piston. When solder balls are to be dispensed, the piston is raised a predetermined distance causing solder balls to flow out of the open top 262 and into the tilt plate 260. The tilt plate 260 is movable between three positions including a fill position, shown in FIG. 12, and left and right tilt positions. In the left and right tilt positions, solder balls are dispensed from the tilt plate through one of the funnels and one of the fill tubes into either the ball container of the front carrier fill station or the ball container of the back carrier fill station.

The operation of the solder ball placement apparatus to place solder balls on semiconductor substrates contained within JEDEC trays will now be described. A first JEDEC tray is loaded into the input buffer conveyor 106. The component transport table 110 is moved out towards the input buffer to receive the first tray and the first tray is loaded on to the conveyor system 124. The conveyor system moves the tray to the work position beneath the flux gantry, such that a first part in the first JEDEC tray is above the moving pedestal 114. The first part is lifted from the tray and aligned with the flux head 103 using the vision alignment system of the flux station. As described above, as the first part is aligned, flux is applied to the pins in the flux head. The flux is then applied to the conductor pads on the first part. The first part is then lowered back into the tray, and the component transport table is moved to position a second part in the first JEDEC tray above the moving pedestal. Flux is then applied to the second part using the same procedure as for the first part described above. Flux is then applied to each of the remaining parts in the JEDEC tray using the same procedure.

The first JEDEC tray is then moved to the working position beneath the place head 105 with the first part in the first JEDEC tray positioned over moving pedestal 116. Simultaneous with the movement of the first JEDEC tray, a second JEDEC tray is loaded onto the component transport table and moved to the working position beneath the flux head with a first part in the second JEDEC tray positioned over moving pedestal 114. The first part in the first JEDEC tray is then lifted by the moving pedestal 116, aligned with the place head, solder balls are placed on the conductor pads of the first part, and the first part is lowered back into the first tray. At substantially the same time that the first part in the first tray receives solder balls, the first part in the second tray receives flux at the flux station. The component transport table is then moved to simultaneously position the second part in the first tray over moving pedestal 116 and the second part in the second tray over moving pedestal 114. Solder balls are then placed on the second part in the first tray, and flux is placed on the second part of the second tray.

The above procedure continues until all of the parts in the first tray have received solder balls and all of the parts in the second tray have received flux. The component transport table is then moved towards the output buffer conveyor 108, and the first tray is then moved from the conveyor system 124 of the component transport table to the output buffer conveyor 108 for removal from the solder ball placement apparatus 100. The component transport table is then moved towards the input buffer conveyor to receive a third tray, the second tray is moved to the working position at the place station, and the third tray is moved to the working position beneath the flux station. The above procedure is then repeated to apply solder balls to the parts in the second tray and to apply flux to the parts in the third tray.

Figure 13:
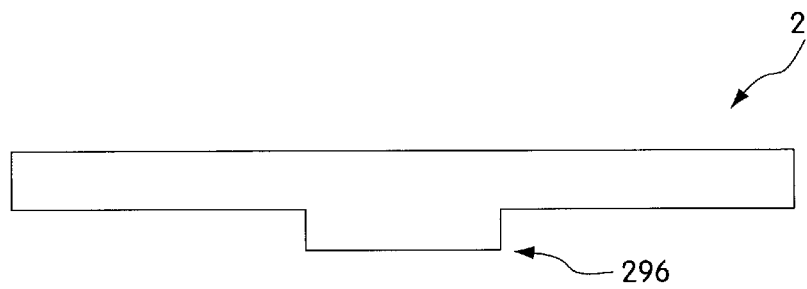
FIG. 13 shows a carrier plate that can be used with embodiments of the present invention.

In some substrates that are to receive solder balls, the surface upon which the solder balls are to be placed are in a recessed portion of the substrate, and for some substrates a holder for the substrate has raised portions such that the substrate is effectively in a recessed portion. In embodiments of the present invention, it is desirable for a bottom surface of the carrier plate to be in close proximity or in contact with the substrate when the pins push the solder balls onto the substrate. To accommodate substrates having recessed portions, the carrier plates used in embodiments of the present invention may have convex portions that extend into a recessed area of a substrate to allow the bottom surface of the carrier plate and the pins to come in close proximity with the substrate. In other embodiments, the carrier plates may have holes or concave portions to receive raised portions of a substrate holder such that the bottom surface of the carrier plate can come in close proximity to the substrate. FIG. 13 shows a carrier plate 298 having a convex portion 299 that may be used with the solder ball placement apparatus 100.

In the procedure described above for operating the solder ball placement apparatus 100, solder balls are applied to one part at the same time that flux is applied to another part, thereby significantly increasing the throughput of the solder ball placement apparatus. In embodiments of the present application discussed above, a pin transfer method is used to place flux on substrates, in other embodiments, a printer or dispenser could be used as the flux station in a solder ball placement apparatus.

In another embodiment of the present invention, the flux station of the solder ball placement apparatus is replaced with a place station, substantially identical to the place station on the solder ball placement apparatus 100, to further increase the throughput by providing simultaneous placement of solder balls on two parts. In this embodiment, the parts loaded into the solder ball placement apparatus receive flux from an upstream flux machine, such as a screen printer or a flux spraying or dispensing machine.

In embodiments described above, the carrier shuttle and fill station includes two fill stations and two carrier trays. In other embodiments, in which lower throughput is acceptable, one fill station and one carrier tray may be used in the carrier shuttle and fill station.

Figure 14:
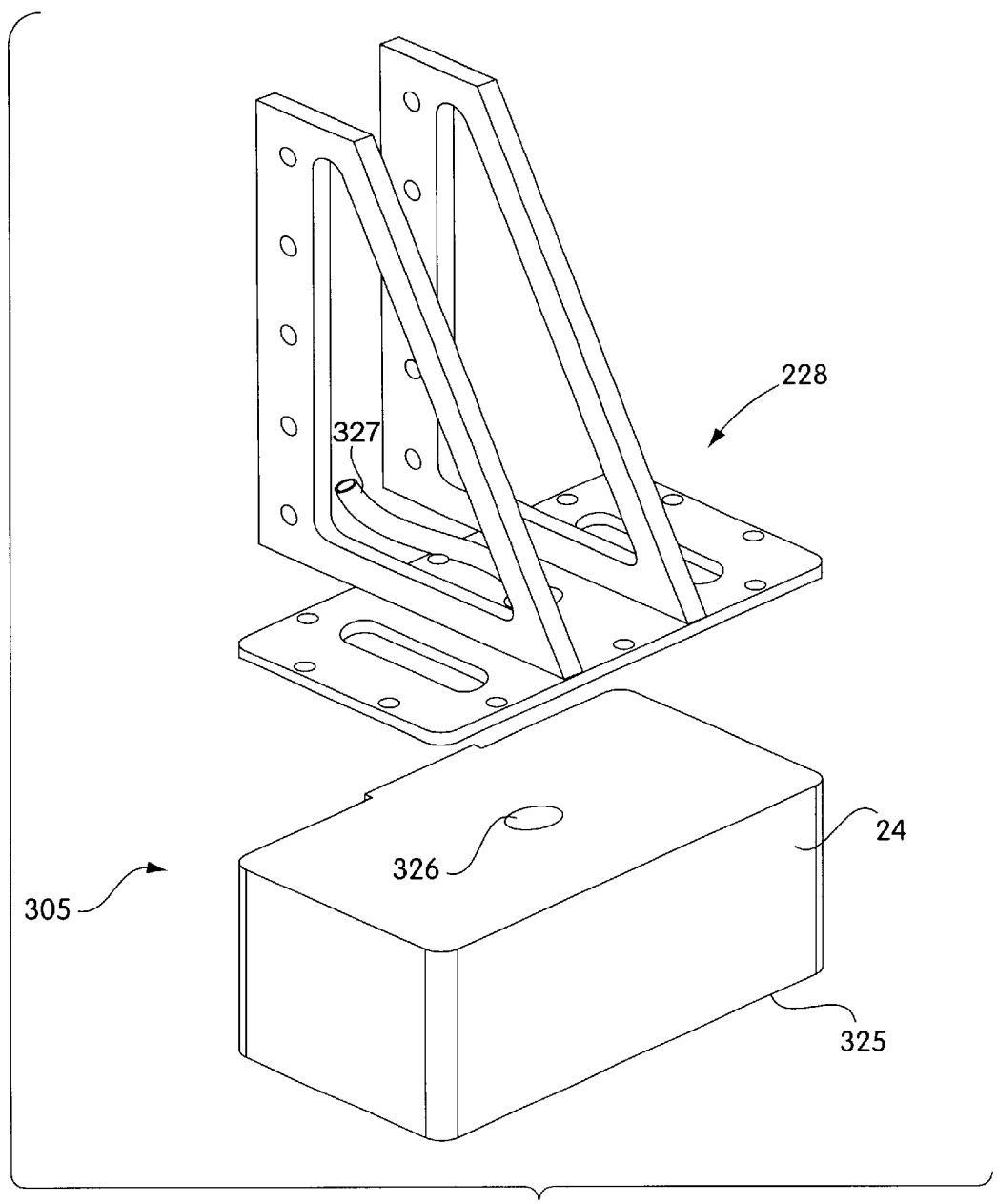
FIG. 14 shows a second embodiment of a place head used with the apparatus of FIG. 1.

In embodiments described above, pins are used in the place head 105 to push solder balls through the carrier plate and onto the contact pads of the part. In another embodiment, a place head 305, shown in FIG. 14, is used in place of the place head 105. Place head 305 uses pressurized air in place of pins to push solder balls through the carrier plate and onto the contact pads. Place head 305 mates with bracket 228 in manner similar to place head 105 and includes an enclosure 324 having a mating surface 325 designed to mate with the carrier plate to form a substantially air tight seal. The enclosure 324 includes an opening 326 for receiving pressurized air from an air hose 327 mounted to the bracket 328.

In operation, the place head 305 is lowered onto the carrier plate, and a burst of air is provided through the air hose 307 to the enclosure 324. The burst of air forces solder balls in the carrier plate onto the contact pads of the part. In some embodiments, the enclosure 324 may include a number of diffuser plates to evenly distribute the air across the solder balls in the carrier plate.

Embodiments of the present invention provide several advantages over prior art systems. First, each of the parts are individually aligned with a placement head using a vision alignment system prior to placement, and each of the parts are individually inspected using a vision alignment system after placement of solder balls on the part. Second, pins or pressurized air are used to positively push solder balls into flux located on the contact pads, rather than relying on gravity as in some prior art devices. The use of pins or pressurized air to positively place solder balls results in the solder balls being firmly placed in the flux, and therefore, less likely to float in the flux during reflow of the solder balls.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An apparatus for placing spheres at predetermined positions on a substrate, the apparatus comprising:
   a platform to support the substrate at a first sphere placement position in the apparatus;
   a placement station disposed above the platform that places spheres at locations on the substrate, the placement station including:
      a first container having a chamber to contain spheres;
      a first carrier tray having a substantially horizontal upper surface that forms a lower surface of the chamber and having a bottom surface, the upper surface having a first section and a second section, the second section having a plurality of holes formed therein to receive spheres, the first carrier tray being movable to position the second section between a fill position beneath the first container and a place position disposed over the first sphere placement position;
   wherein the placement station is constructed and arranged to fill the plurality of holes with spheres when the second section is in the fill position; to allow the spheres to pass through the holes, entering from the upper surface of the first carrier tray and exiting via the bottom surface of the first carrier tray; and to place the spheres at the predetermined positions on the substrate when the second section is in the place position;
   wherein the placement station further includes:
      a second container having a chamber to contain spheres;
      a second carrier tray having a substantially horizontal upper surface that forms a lower surface of the chamber of the second container, the upper surface having a first section and a second section, the second section having a plurality of holes formed therein to receive spheres, the second carrier tray being movable to position the second section between a fill position beneath the second container and the place position;
      wherein the placement station is constructed and arranged to fill the plurality of holes in the second carrier tray with spheres when the second section of the second carrier tray is in the fill position, and place the spheres at the predetermined positions on the substrate when the second section of the second carrier tray is in the place position.

2. An apparatus for placing spheres at predetermined positions on a substrate, the apparatus comprising:
   a platform to support the substrate at a first sphere placement position in the apparatus;
   a placement station disposed above the platform that places spheres at locations on the substrate, the placement station including:
      a first container having a chamber to contain spheres;
      a first carrier tray having a substantially horizontal upper surface that forms a lower surface of the chamber and having a bottom surface, the upper surface having a first section and a second section, the second section having a plurality of holes formed therein to receive spheres, the first carrier tray being movable to position the second section between a fill position beneath the first container and a place position disposed over the first sphere placement position;
   wherein the placement station is constructed and arranged to fill the plurality of holes with spheres when the second section is in the fill position; to allow the spheres to pass through the holes, entering from the upper surface of the first carrier tray and exiting via the bottom surface of the first carrier tray; and to place the spheres at the predetermined positions on the substrate when the second section is in the place position;
   wherein the first carrier tray includes a lower section disposed beneath the second section of the upper surface, the lower section having a plurality of holes corresponding to the plurality of holes in the second section, the first carrier tray being constructed and arranged to allow relative movement between the lower section and the second section between a first relative position in which the holes in the second section are in align with the holes in the lower section and a second relative position in which the holes in the second section are not in align with the holes in the lower section.

3. The apparatus of claim 1, wherein the placement station further includes a vision system positionable over the first carrier tray to view the spheres in the plurality of holes prior to placement of the spheres on the substrate.

4. The apparatus of claim 3, wherein the vision system is further positionable to view the spheres on the substrate after placement of the spheres on the substrate.

5. The apparatus of claim 4, wherein at least a portion of the platform is movable along a first axis and a second axis to position the substrate, wherein the first axis is orthogonal to the second axis, and wherein the first axis and the second axis define a plane that is substantially parallel to the upper surface of the first carrier tray.

6. The apparatus of claim 5, further comprising a first pedestal constructed and arranged to lift the substrate above the platform prior to placement of spheres on the substrate, the first pedestal being movable, independent of the platform, to align the predetermined positions on the substrate with spheres on the first carrier tray.

7. The apparatus of claim 6, wherein the first pedestal is constructed and arranged to provide movement of the substrate along the first axis and the second axis and to provide rotation of the substrate about an axis that is perpendicular to the plane defined by the first and the second axis.

8. The apparatus of claim 7, wherein the vision system is positionable over the pedestal to view the substrate prior to placement to determine any error in alignment between the predetermined positions on the substrate and spheres on the first carrier tray.

9. The apparatus of claim 8, wherein the placement station further includes a placement head having a plurality of placement pins each corresponding to one of the plurality of holes in the upper surface of the first carrier tray, wherein the placement head is disposed above the first sphere placement position and can be lowered to place each of the pins in contact with a sphere in a hole of the first carrier tray to push the sphere through the hole and onto the substrate.

10. The apparatus of claim 1, wherein the first carrier tray includes a lower section disposed beneath the second section of the upper surface, the lower section having a plurality of holes corresponding to the plurality of holes in the second section, the first carrier tray being constructed and arranged to allow relative movement between the lower section and the second section between a first relative position in which the holes in the second section are in align with the holes in the lower section and a second relative position in which the holes in the second section are not in align with the holes in the lower section.

11. The apparatus of claim 10, wherein the first container includes at least one deflection plate disposed within the chamber, the deflection plate having a deflection surface and being disposed in the chamber such that the deflection surface forms an obtuse angle with the upper surface of the first carrier tray.

12. The apparatus of claim 11, further comprising a conveyor system, disposed on the platform, to load and unload substrates from the apparatus, the conveyor system having a first conveyor section, a second conveyor section and a third conveyor section, each of the first conveyor section, the second conveyor section and the third conveyor section being independently controllable.

13. The apparatus of claim 1, further comprising a flux station, disposed above a flux position on the platform, that places flux on substrates.

14. The apparatus of claim 13, wherein the flux station further includes a vision system positionable over the flux position to view a substrate at the flux position.

15. The apparatus of claim 14, further comprising a second pedestal constructed and arranged to lift a substrate at the flux position above the platform prior to placement of flux on the substrate, the second pedestal being movable, independent of the platform.

* * * * *